(12) United States Patent
Shareef et al.

(10) Patent No.: US 7,326,877 B2
(45) Date of Patent: Feb. 5, 2008

(54) LASER THERMAL PROCESSING CHUCK WITH A THERMAL COMPENSATING HEATER MODULE

(75) Inventors: Iqbal A. Shareef, Fremont, CA (US); Igor Landau, Palo Alto, CA (US); David A. Markle, Saratoga, CA (US); Somit Talwar, Los Gatos, CA (US); Michael O. Thompson, Ithaca, NY (US); Ivelin A. Angelov, Sunnyvale, CA (US); Senquan Zhou, San Jose, CA (US)

(73) Assignee: Ultratech, Inc., San Jose, CA (US)

( * ) Notice: Subject to any disclaimer, the term of this patent is extended or adjusted under 35 U.S.C. 154(b) by 571 days.

(21) Appl. No.: 11/002,043

(22) Filed: Dec. 1, 2004

(65) Prior Publication Data

US 2007/0004232 A1    Jan. 4, 2007

(51) Int. Cl.
*B23K 26/00* (2006.01)
(52) U.S. Cl. ............................ 219/121.65; 219/121.66; 219/121.82; 219/444.1
(58) Field of Classification Search ............ 219/121.65, 219/121.66, 121.82, 390, 399, 444.1
See application file for complete search history.

(56) References Cited

U.S. PATENT DOCUMENTS

| | | | | |
|---|---|---|---|---|
| 5,025,133 A | * | 6/1991 | Tsutahara et al. | 219/444.1 |
| 5,769,154 A | * | 6/1998 | Adkins et al. | 165/104.26 |
| 6,291,801 B1 | * | 9/2001 | Guidotti et al. | 219/390 |
| 6,366,308 B1 | | 4/2002 | Hawryluk et al. | 347/256 |
| 6,747,245 B2 | | 6/2004 | Talwar et al. | 219/121.8 |
| 7,195,693 B2 | * | 3/2007 | Cowans | 118/725 |
| 2006/0113290 A1 | * | 6/2006 | Shareef et al. | 219/121.82 |

* cited by examiner

*Primary Examiner*—Geoffrey S. Evans
(74) *Attorney, Agent, or Firm*—Allston L. Jones

(57) ABSTRACT

Chuck methods and apparatus for supporting a semiconductor substrate and maintaining it at a substantially constant background temperature even when subject to a spatially and temporally varying thermal load. Chuck includes a thermal compensating heater module having a sealed chamber containing heater elements, a wick, and an alkali metal liquid/vapor. The chamber employs heat pipe principles to equalize temperature differences in the module. The spatially varying thermal load is quickly made uniform by thermal conductivity of the heater module. Heatsinking a constant amount of heat from the bottom of the heater module accommodates large temporal variations in the thermal heat load. Constant heat loss is preferably made to be at least as large as the maximum variation in the input heat load, less heat lost through radiation and convection, thus requiring a heat input through electrical heating elements. This allows for temperature control of the chuck, and hence the substrate.

20 Claims, 4 Drawing Sheets

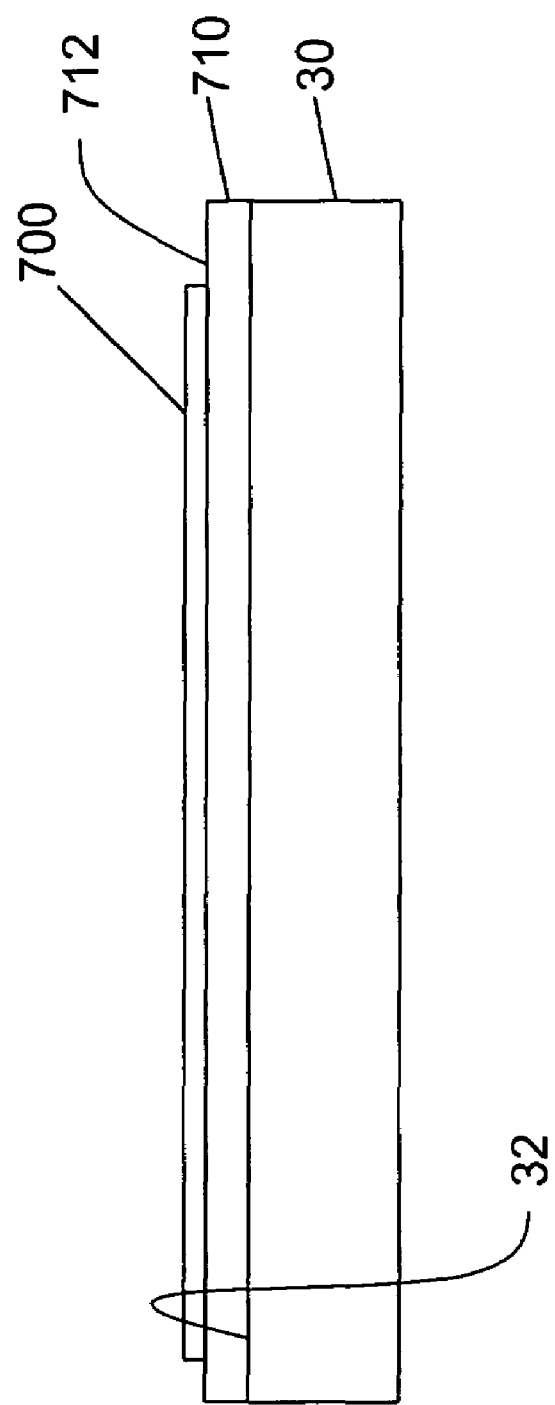

LASER THERMAL PROCESSING CHUCK WITH A THERMAL COMPENSATING HEATER MODULE

CROSS-REFERENCE TO RELATED APPLICATIONS

The present patent application is related to U.S. patent application Ser. No. 11/001,954, entitled "Heated Chuck for Laser Thermal Processing," filed on Dec. 1, 2004, the same day as the current application, and both are assigned to the present Assignee, Ultratech, Inc., of San Jose, Calif., which patent application is incorporated by reference herein.

BACKGROUND OF THE INVENTION

1. Field of the Invention

The present invention relates to apparatus and methods for thermally processing semiconductor substrates in semiconductor manufacturing, and in particular relates to support members ("chucks") for supporting a substrate (semiconductor wafer) during laser thermal processing (LTP).

2. Description of the Prior Art

The fabrication of integrated circuits (ICs) involves subjecting a semiconductor substrate to numerous processes, such as photoresist coating, photolithographic exposure, photoresist development, etching, polishing, and in some cases heating or "thermal processing". Thermal processing is used, for example, to activate dopants in doped regions (e.g., source and drain regions) of the substrate for certain types of ICs. Thermal processing includes various heating (and cooling) techniques, such as rapid thermal annealing (RTA) and laser thermal processing (LTP).

Various techniques and systems for performing LTP of semiconductor substrates ("wafers") are known and are used in semiconductor device manufacturing. Example LTP systems and methods are described in U.S. Pat. No. 6,747,245 entitled "Laser Scanning Apparatus and Methods for Thermal Processing" (the '245 Patent), and in U.S. Pat. No. 6,366,308 B1, entitled "Laser Thermal Processing Apparatus and Method" (the '308 Patent), which patents are incorporated by reference herein.

LTP involves rapidly bringing the temperature of the wafer up to the annealing temperature and then rapidly back down to the starting (e.g., ambient or background) temperature in a single cycle. Given of the relatively large sizes of the typical wafers used in semiconductor manufacturing (e.g., 300 mm in diameter), the heat is more efficiently applied to only a small region of the wafer at a given time.

Using the '245 patent and the '308 patent as examples, a laser beam is formed into a narrow high-intensity image (e.g., a line image) that is scanned over the wafer surface, e.g., in a raster pattern. This process can involve a heat flux in excess of 1000 W/mm$^2$ over the narrow image. The peak temperature TP reached by the wafer surface at the region being irradiated during LTP is relatively high (e.g., ~1,300° C.).

The uniformity of the peak temperature TP determines the sheet resistance uniformity of activated doped regions formed therein, which in turn determines the performance of resulting semiconductor devices.

Attaining a uniform peak temperature TP over the wafer depends on the stability of the laser power and on the temperature uniformity of the wafer surface (referred to hereinbelow as the "background substrate temperature"). Maintaining a constant background temperature of the substrate, however, is problematic when the LTP process utilizes a spatially varying thermal load such as a scanned laser beam.

Accordingly, the art of LTP and related arts would benefit from apparatus and methods directed to maintaining the substrate being processed at a constant background temperature at the locations of the substrate not being directly subjected to the spatially varying thermal load.

SUMMARY OF THE INVENTION

One aspect of the invention is a chuck apparatus for laser thermal processing a substrate. The apparatus includes a housing having a planar upper surface, a lower surface, and an enclosed interior chamber. The chamber has a peripheral interior surface, which generally consists of the inner surfaces of the outer portions of the housing, such as the bottom surface of a top plate, the upper surface of a bottom plate, and the inner surface of a cylindrical sidewall capped by the top and bottom plates. The chamber is adapted to contain a metal in liquid and vapor form (referred to herein simply as a "metal liquid/vapor"). The chuck apparatus includes one or more heating elements arranged within the chamber interior. The one or more heating elements are adapted to heat the housing and the metal liquid/vapor to a background temperature. The apparatus also includes one or more wicks arranged adjacent the chamber peripheral interior surface. The one or more wicks are adapted to supply liquid metal to most, or all, of the chamber peripheral interior surface. Portions of the metal liquid/vapor are redistributed within the chamber by vaporizing the liquid metal at a hot spot within the chamber formed by heat transferred from the substrate to the chamber, and condensing the metal vapor away from the hot spot. This redistribution of the metal liquid/vapor serves to quickly uniformize the temperature of the housing, so that the temperature of the housing can be maintained at the background temperature.

Another aspect of the invention is a method of maintaining a substrate at a substantially constant background temperature while subjecting the substrate to a spatially varying thermal load, such as from a laser beam used to perform LTP of a semiconductor wafer as the substrate. The method includes transferring heat associated with the spatially varying thermal load from the substrate to a metal liquid/vapor held within a sealed chamber in thermal communication with the substrate. The transferred heat forms within the chamber a hot spot that is surrounded by cooler regions. The method also includes redistributing portions of the metal liquid/vapor by vaporizing the liquid metal at the hot spot, and condensing the metal vapor in the cooler regions to uniformize the temperature of the sealed chamber, and consequently, the substrate in good thermal communication therewith. The method may also include removing heat from the chamber using, for example, a heat sink in good thermal communication with the chamber.

BRIEF DESCRIPTION OF THE DRAWINGS

FIG. 4 is a close-up side view of the example embodiment of the top plate having a protective layer formed thereon that prevents contamination of the substrate.

Figure 1:
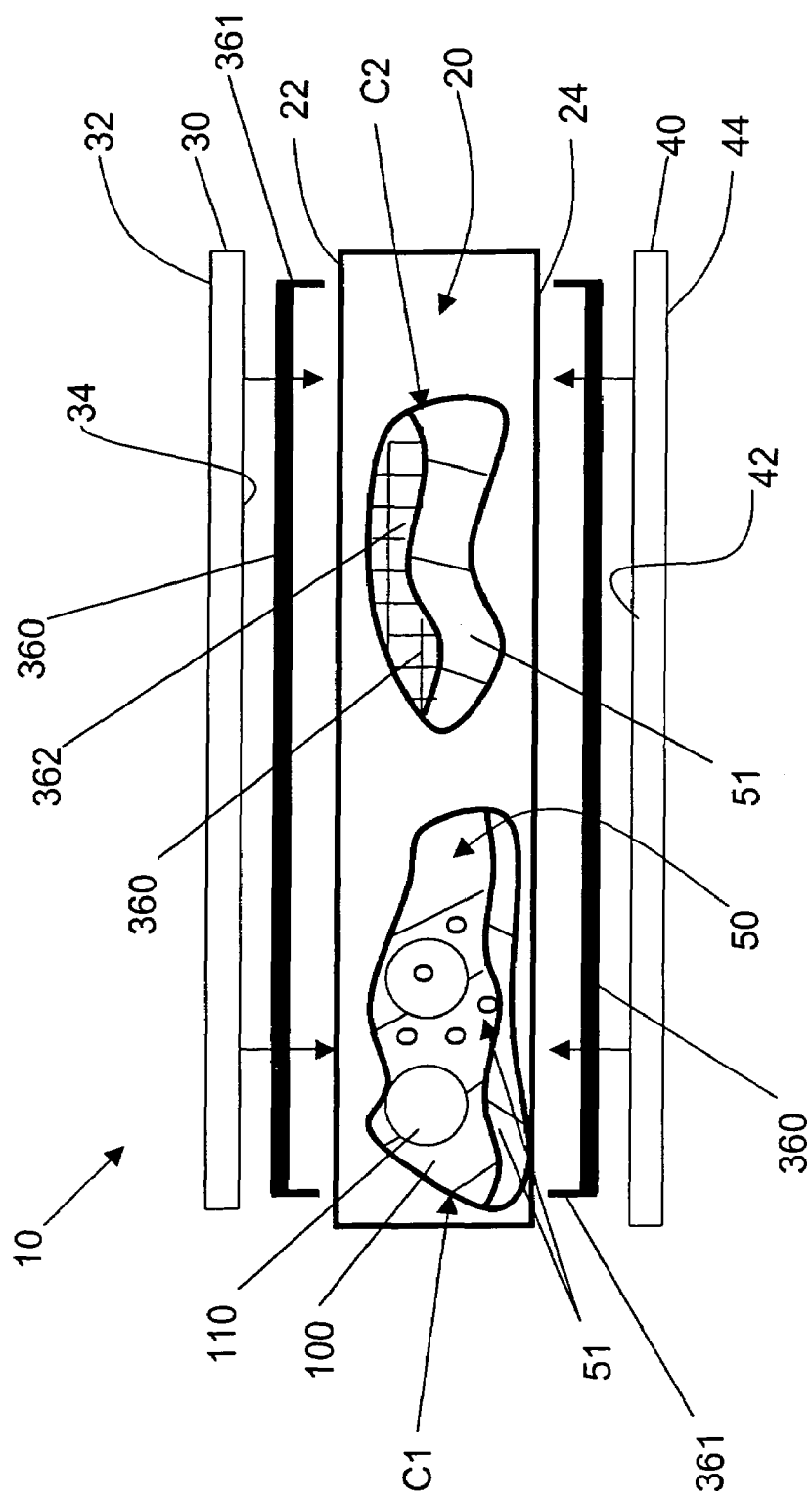
FIG. 1 is an exploded side view of an example embodiment of the heater module of the present invention illustrating a short, hollow cylindrical center section capped by top and bottom plates that define the module chamber, and wherein a first cut-out (C1) shows liquid and metal vapor within the chamber, a support brace along with openings in the braces that permit the circulation of metal throughout the chamber, and a second cut-out (C2) shows a wick that lines most or all of the chamber interior surface, and liquid metal being conducted by the action of the wick to cover the chamber peripheral interior surface.

The various elements depicted in the drawings are merely representational and are not drawn to scale. Certain proportions thereof may be exaggerated, while others may be minimized. The drawings are intended to illustrate various implementations of the invention, which can be understood and appropriately carried out by those of ordinary skill in the art.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

As mentioned above, achieving a uniform peak temperature over the substrate surface during LTP is critical in manufacturing semiconductor devices that require uniform sheet resistance of activated doped regions. Achieving peak temperature uniformity in LTP is facilitated by creating an environment wherein the substrate efficiently absorbs energy from the incident LTP laser beam. If the substrate is undoped or lightly doped, it is necessary to bring the substrate up to a constant background temperature TC prior to irradiating the substrate with the LTP laser beam in order to increase the absorption of the laser beam. Failure to do this can result in the beam passing through the substrate and to the chuck in some cases. Further, it involves maintaining the substrate at the constant background temperature TC even as the scanned LTP laser beam subjects the substrate to a spatially varying thermal load.

The chuck of the present invention is adapted to maintain a constant background substrate temperature TC significantly higher than room temperature even when the substrate is subject to the spatial varying thermal load from a scanned LTP laser beam. In an example embodiment, constant background temperature TC is in the range from about 350° C. to about 450° C. In one example embodiment, the constant background temperature TC is kept uniform across the substrate to +/−4° C., and in another example embodiment is kept uniform across the substrate to +/−6° C.

In the description below, the phrase "spatially varying thermal load" is used to describe the delivery of heat to different locations (positions) on the substrate at different times, e.g., by scanning an LTP laser over the substrate surface to be processed. As discussed below, the spatially varying thermal load on the substrate is communicated to corresponding locations within the heater module chamber.

Also, the phrase "constant background temperature" is understood to mean "constant or substantially constant," wherein the variation in the background temperature is held to within a range that does not substantially affect the resultant LTP process. Likewise, the "constant background temperature" is assumed to be substantially uniform, i.e., is uniform over the substrate to the degree necessary to perform LTP of the substrate without substantial adverse results.

Also, in a preferred embodiment, the "constant background temperature" is elevated, i.e., is significantly higher than room temperature, e.g., 350° C. to 450° C. Also, the "constant background temperature" refers to the temperature of a portion of an object (e.g., the substrate) other than that portion immediately surrounding the spatially varying thermal load at any given time.

Further, the terms "gas" and "vapor" are used interchangeably herein. Also, as discussed below, the where term "metal" is intended to include both the liquid and vapor states, the phrase "metal liquid/vapor" is used for the sake of abbreviation and clarity.

Heater Module

Figure 2:
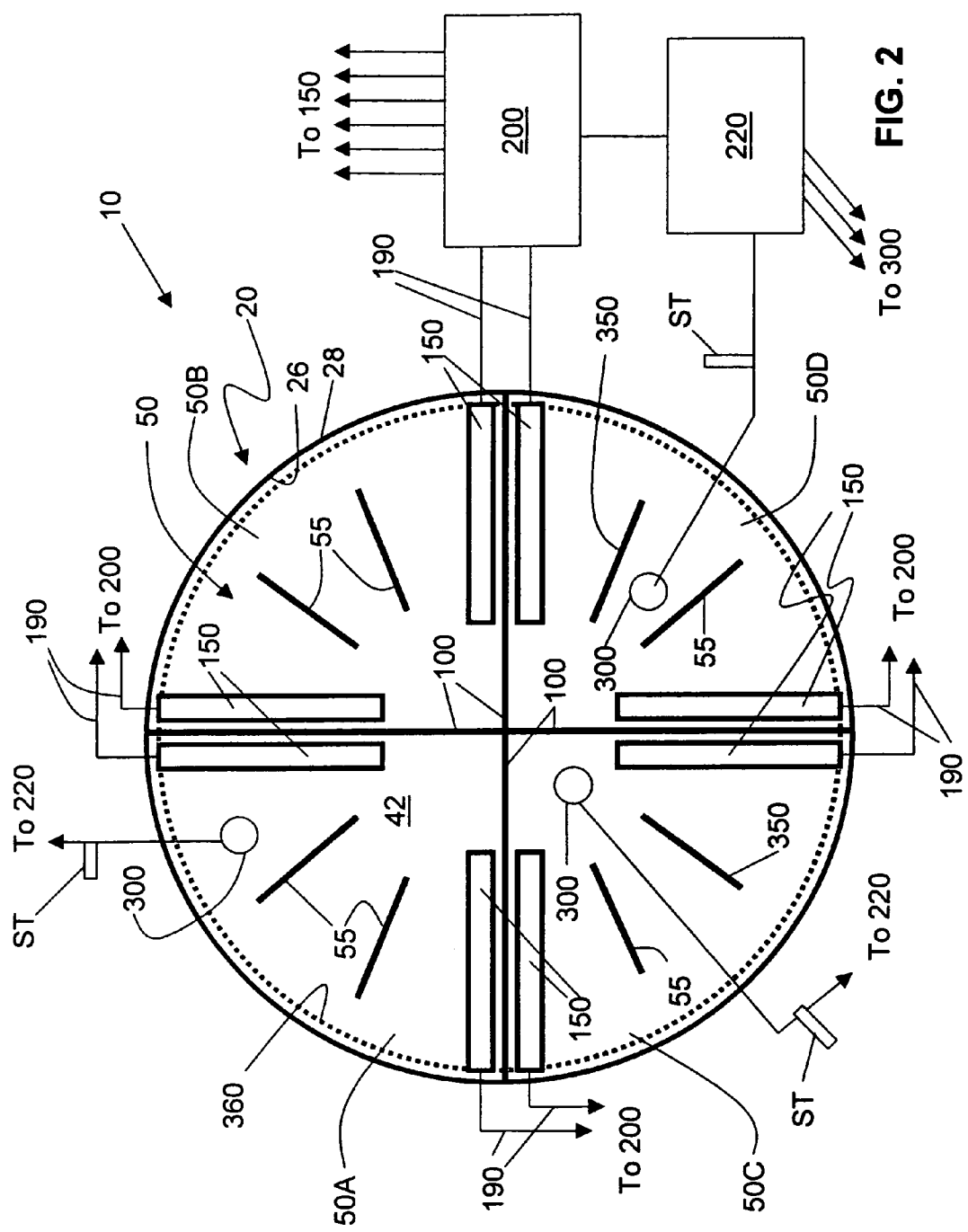
FIG. 2 is a top-down view of an example embodiment of the present invention, shown with the heater module of the present invention, shown with the top plate removed and a portion of the wick removed to reveal the internal components within the module chamber, and showing a portion of the wick (dotted line) adjacent the inner surface of the sidewall.

FIG. 1 is an exploded side view of an example embodiment of a heater module 10 used in the chuck of the present invention. The chuck is described in detail below. Heater module 10 includes hollow cylindrical section (sidewall) 20 having respective upper and lower rims 22 and 24 and respective inner and outer surfaces 26 and 28 (FIG. 2). Attached to upper rim 22 is a top plate 30, and attached to lower rim 24 is a bottom plate 40. Top plate 30 has an upper surface 32 and a lower surface 34, and bottom plate 40 has an upper surface 42 and a lower surface 44. Sidewall 20, top plate 30 and bottom plate 40 constitute an enclosed, sealed housing having an enclosed interior chamber 50. In an example embodiment, top plate 30 and bottom plate 40 are respectively sealed to upper and lower sidewall rims 22 and 24, e.g., by welding.

Chamber 50 contains a metal 51, which may be solid at room temperature, and both a liquid and a gas at the elevated operating or background temperature. Note that the portion of metal 51 in the vapor state is shown as small circles in FIG. 1 for the sake of illustration. In an example embodiment, metal 51 is or includes an alkali metal, such as one or more of potassium, cesium and sodium. In an example embodiment, metal 51 is introduced to interior chamber 50 during assembly and is permanently sealed therein during the operation of the heater module. In an example embodiment, the inner surface 26 of sidewall 20, the bottom plate upper surface 42 and the top plate lower surface 34 define an example of a "chamber peripheral interior surface."

In an example embodiment, sidewall 20 is formed from Monel-metal. Also in an example embodiment, top plate 30 and bottom plate 40 are formed from or otherwise include Monel-metal in order to safely contain metal liquid/vapor 51, which in the case of an alkali metal such as potassium is very reactive.

FIG. 2 is a top-down view of heater module 10 of FIG. 1, shown with top plate 30 removed to reveal the internal components of the module that reside within chamber 50. In an example embodiment, heater module 10 includes one or more thin, rectangularly shaped braces 100 that span chamber 50 from one portion of sidewall inner surface 26 to another, and that extend upward from bottom plate upper surface 42 up to the plane defined by upper rim 22. Braces 100 serve to define sub-chambers, such as sub-chambers 50A, 50B, 50C and 50D, within chamber 50. Braces 100 preferably include openings 110 (FIG. 1) sized to allow for metal liquid/vapor 51 to flow between the sub-chambers and throughout the entire chamber 50, as described below. In an example embodiment, braces 100 are arranged at equal angles relative to one another and divide chamber 50 into equal-sized sub-chambers, such as the four sub-chambers 50A-50D, as illustrated. In an example embodiment, heater module 10 also includes support members 55, arranged in chamber 50 and mechanically coupled to top plate 30 and to bottom plate 40 to add stiffness to the heater module.

Heater module 10 further includes one or more heating elements 150, such as heater cartridges, arranged to heat chamber 50. Heating elements 150 serve to heat chamber 50, and to convert some of the liquid metal to vapor. In an example embodiment, a number of heating elements (e.g., eight, as show in FIG. 2) are arranged adjacent inner surface 26 of sidewall 20 and extend inwardly toward the center of the chamber. In an example embodiment, a heating element 150 is arranged on either side of each brace 100 so that each sub-chamber 50A-50D contains two heater elements.

Each heating element 150 is connected to a lead 190 (e.g., wires) that connects the heating element to a power supply 200. Power supply 200 is adapted to provide select amounts of power to the heating elements, as described in greater detail below. Power supply 200 is operably connected to a heater module controller 220 that controls the operation of heater module 10, as described in detail below. Each heating element 150 generates heat by dissipating electrical power provided to it by power supply 200.

Heater module 10 also includes one or more temperature probes 300 at corresponding one or more positions within chamber 50. Temperature probes 300 measure the temperature of chamber 50 at each of the one or more locations and generate corresponding temperature signals ST in response thereto. Temperature probes 300 are operably coupled to heater module controller 220, which is adapted to receive and process the temperature signals.

With reference to FIGS. 1 and 2, heater module 10 includes one or more wicking elements ("wicks") 360 that cover most or all of chamber 50 peripheral interior surface. Wicks 360 serve to transport by capillary action liquid metal to most or all of the chamber peripheral interior surface. This process is illustrated in FIG. 1 in cut-out C1, which illustrates liquid metal 51 being conducted up wick 360 toward top plate lower surface 34 so that the chamber 50 peripheral interior surface is covered with a thin coating or film of liquid metal.

In an example embodiment, one or more wicks 360 are supported by or are fixed to bottom plate upper surface 42 and extend upward along inner wall surface 26 of sidewall 20 and extend across top plate lower surface 34. In an example embodiment, one or more wicks 360 also cover heater elements 150 to facilitate the heating of liquid metal 51.

In FIG. 1, the wicks 360, shown adjacent top and bottom plates 30 and 40, have respective folded ends 361 that extend downward and upward along the inner surface 26 of sidewall 20. This wick arrangement illustrates example embodiments wherein the folded ends either establish contact with an existing wick arranged along inner surface 26, or meet up with one another to cover some or all of the sidewall inner surface.

In respective example embodiments, each wick 360 is in the form of a screen or fiber bundle made of metal, ceramic or glass compatible with the metal liquid/vapor. The material used in wicks 360 is preferably readily "wet" by the liquid metal. Wick 360 has interstices 362 sized to support capillary transfer of liquid metal 51 to those portions of the chamber peripheral interior surface not otherwise accessible by the liquid metal at rest within the chamber. The term "wet" as used herein refers to the requirement for a small contact angle between the liquid metal and the wick material. The wicking action of one or more wicks 360 serves to maintain a film of liquid metal on those portions of chamber peripheral interior surface that play a significant role in heat transport to and from the chamber, as described below. In an example embodiment, the entire chamber peripheral interior surface is covered with a film of liquid metal using one or more of wicks 360.

Chuck With Heater Module

Figure 3:
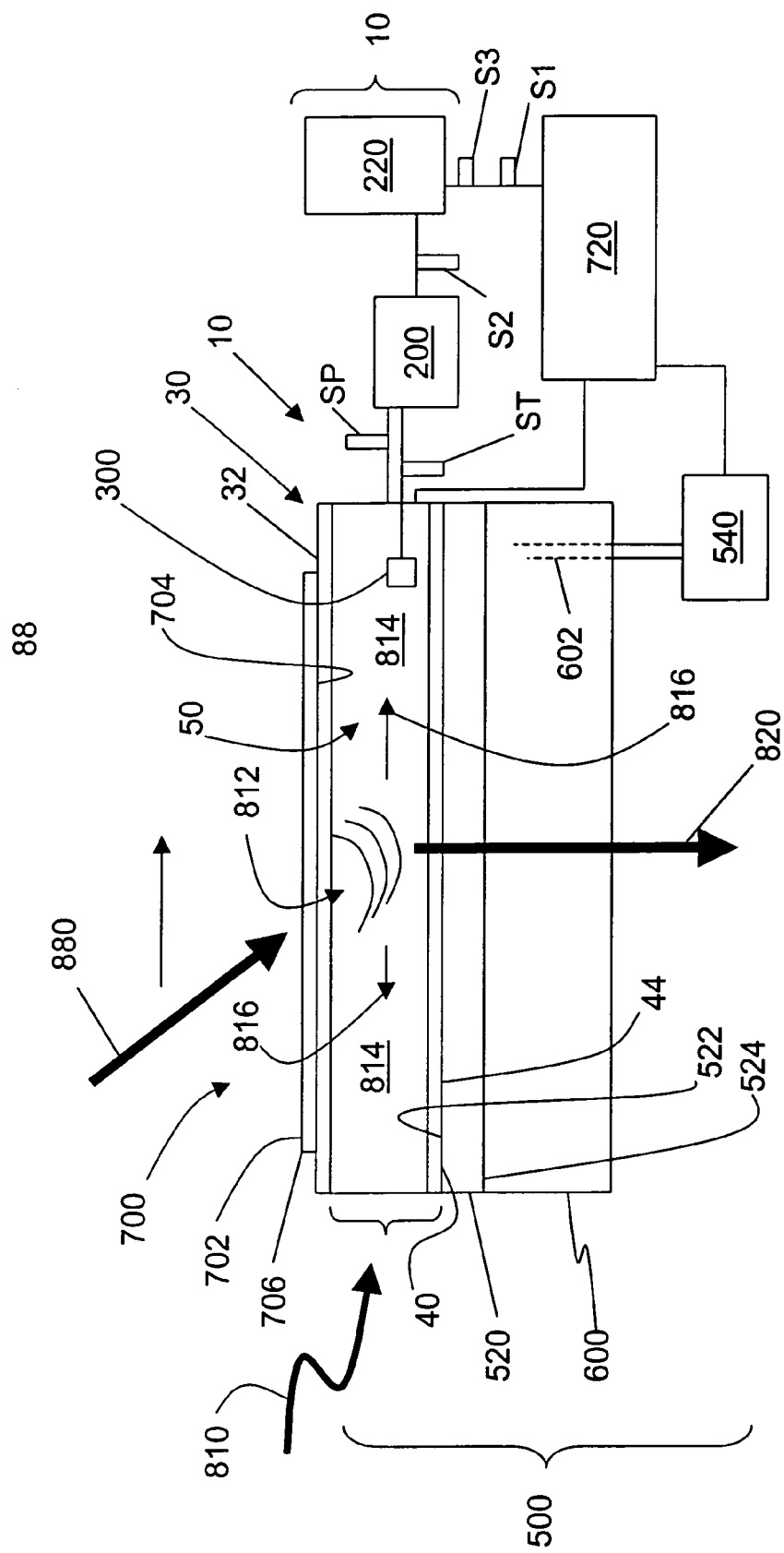
FIG. 3 is a cross-sectional view of a heated chuck for performing LTP of a substrate using an LTP laser beam, wherein the chuck includes the heater module of FIG. 1, and illustrating the hot spot (812) and the cooler regions (814) of the chamber interior that occur during LTP irradiation.

FIG. 3 is a side view of a heated chuck 500 for laser thermal processing according to the present invention, and that includes the heater module 10 discussed above. Chuck 500 includes a thermal insulator layer 520 having an upper surface 522 and a lower surface 524. In an example embodiment, insulator layer 520 is arranged with its upper surface 522 immediately adjacent lower surface 44 of bottom plate 40 so that the insulator layer and the heater module are in good thermal communication. In an example embodiment, insulator layer 520 is in direct contact with bottom plate 40, while in another example embodiment a thin layer of flexible graphite (not shown), such as GRAFOIL® (available from American Seal and Packing Co., Fountain Valley, Calif.), is arranged between the insulator layer and the bottom plate. In an example embodiment, insulator layer 520 is a plate of fused silica or quartz. In an example embodiment, insulator layer 520 includes LD-80, available from Pyromatics Corporation of Willoughby, Ohio.

Chuck 500 also includes a heat sink 600 arranged to be in good thermal communication with the insulator layer 520 through lower surface 524. In an example embodiment, heat sink 600 is in the form of a cooled plate made from a material with a high thermal conductivity. In an example embodiment, the cooled plate of the heat sink is made of aluminum. In an example embodiment, heat sink 600 includes a cooling channel 602 (partially shown in FIG. 3) fluidly coupled to a cooling unit 540 adapted to flow a cooling fluid through the cooling channel to remove heat from the heat sink. In an example embodiment, cooling channel 602 is formed in the cooled plate.

Insulator layer 520 is arranged between heater module 10 and heat sink 600 and is adapted to maintain a substantially constant thermal gradient between the two. In an example embodiment, heater module 10 is at a temperature of about 400° C., while heat sink 600 is at a temperature of about 20° C.

Upper surface 32 of top plate 30 is adapted to support a substrate (semiconductor wafer) 700 having an upper surface 702, a lower surface 704 and an outer edge 706. With reference to FIG. 4, in an example embodiment, top plate 30 includes, atop upper surface 32, a layer 710 of material (e.g., a coating or a plate) having an upper surface 712 upon which substrate 700 is supported. The material making up layer 710 is one that does not contaminate substrate 700. Example materials for layer 710 include silicon, silicon oxide or silicon nitride, or any combination thereof.

With reference again to FIG. 3, chuck 500 also includes a chuck controller 720 operably coupled to heater module controller 220. Chuck controller 720 controls the operation of the chuck, including the heater module, as described below. Chuck controller 720 is also operably coupled to cooling unit 540 to control the flow of a cooling fluid (e.g., water) through cooling channel 602 of heat sink 600.

Method of Operation

With continuing reference to FIG. 3, there is also shown a LTP laser beam 880 incident upon substrate upper surface 702. LTP laser beam 880 is moved ("scanned") over substrate surface 702 as part of performing LTP of substrate 700, e.g., to activate dopants in the substrate at or near the substrate upper surface.

LTP laser beam 880 presents a spatially varying thermal load to the substrate that will ultimately end up increasing the substrate's background temperature if the heat it creates in the substrate is not properly dissipated. Any change in the substrate background temperature creates undesirable variations in the LTP process, and in particular affects the activation of dopants in the substrate during LTP.

Accordingly, prior to irradiating substrate 700 with LTP laser beam 880, chuck controller 720 instructs heater module controller 220 via a signal S1 to activate power supply 200 via signal S2. In response thereto, power supply 200 provides electrical power (shown schematically as arrow 810) to heating units 150 via a power signal SP, which heats up heater module 10 by introducing heat into chamber 50. In an example embodiment, the power input from power supply 200 is about 3.5 kW steady state to maintain heater module 10 at about 400° C.

The liquid metal 51 contained in chamber 50 is heated by heating units 150. This heat quickly and uniformly spreads over the entire inner surface of chamber 50 of heater module 10 via the wicking action of wicks 360 and the evaporation and condensation of the metal liquid/vapor within the chamber. Heat transport is highest at the chamber peripheral interior surface, which is mostly, or entirely, covered by wicks 360. With substrate 700 in good thermal contact with heater module 10, the substrate takes on the constant background temperature TC of the heater module.

Heater module controller 220 also receives temperature signals ST from temperature probes 300 and uses these signals to regulate the temperature of heater module 10 by providing the temperature information to the heater module controller 220. In response, heater module controller 220 regulates the amount of power 810 (via power signal SP) supplied by power supply 200 to heating units 150. In this manner, the temperature of the heater module, as measured by temperature probes 300, can be precisely controlled, e.g., to within 1° C.

With continuing reference to FIG. 3, when substrate 700 is brought up to a desired constant background temperature TC, then LTP laser beam 880 is scanned over substrate upper surface 702. This introduces a spatially varying thermal load on the substrate, which translates to a spatially varying temperature on the substrate. This, in turn, creates a corresponding spatially varying temperature within chamber 50 of heater module 10. Chamber 50 has a "hot spot" 812 corresponding to the position of the LTP laser beam at substrate surface 702, and "cooler regions" 814 surrounding the hot spot. Hot spot 812 moves around chamber 50 as LTP laser beam 880 scans over substrate surface 702.

The temperature variation in chamber 50 caused by the spatially varying thermal load is quickly ironed out by the evaporation and condensation of metal liquid/vapor 51 within the chamber, by the movement of the metal vapor throughout the chamber volume, and by the movement of the liquid metal via capillary action through the one or more wicks 360 covering the chamber peripheral interior surfaces. The transfer of heat and metal vapor from hot spot 812 out to cooler regions 814 is illustrated in FIG. 3 by arrows 816.

Metal 51 in liquid form is capable of absorbing copious amounts of heat by evaporation because of its large latent heat of vaporization. The metal liquid turns to vapor in the "hot spots" 812 in the cavity corresponding to the location of the scanned LTP laser beam 880 at substrate 700. The vaporized metal is then replaced by liquid metal via capillary action of one or more wicks 360. The metal vapor then condenses to a liquid state in the cooler regions 814 of the chamber as the spatially varying thermal load moves to a different region of the chamber. The heat taken in by heater module 10 is transferred to heat sink 600 through insulator layer 520, and is dissipated, as illustrated by power-out arrow 820.

Insulator layer 520 is adapted to maintain a substantially constant thermal gradient between the heater module and the heat sink, and therefore transfers heat from one to the other at a substantially constant rate. This rate is chosen so that the heater module can be electrically controlled at the constant background temperature, even when the laser is operated at maximum power.

In an example embodiment, the amount of heat removed from chamber 50 is greater than that provided by the spatially varying thermal load associated with LTP laser beam 880, less an amount of heat lost by radiation and convection from substrate 700 and the heater chamber. This ensures that the heating system (i.e., heating elements 150, power supply 200, heater module controller 220 and temperature probes 300) is required to provide some heat to maintain the heater module, and thus the substrate, at the substantially constant background temperature TC.

The very high thermal conductivity effectively provided by heater module 10 ensures a high degree of temperature uniformity (e.g., to within +/−4° C.) except, of course, at or in close proximity to the position on the substrate being subject to the thermal load, e.g., LTP laser beam 880. This in turn allows the substrate to have a uniform constant background temperature TC at those locations not being irradiated by LTP laser beam 880. The maximum temperatures reached during the LTP process depend primarily on the substrate temperature at the beginning of the annealing cycle and the power stability in the laser beam. Keeping the substrate temperature uniform therefore assists in keeping the LTP annealing process uniform. This translates into consistent and reliable device performance.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. A heater module apparatus for a laser thermal processing chuck, comprising:
    a housing having a planar upper surface, a lower surface, and an enclosed interior chamber with a chamber peripheral interior surface;
    a metal in liquid and vapor form ("metal liquid/vapor") held in the chamber at a substantially constant background temperature;

one or more heating elements arranged within the chamber interior and adapted to heat the housing and the metal liquid/vapor to a background temperature; and one or more wicks arranged adjacent the chamber peripheral interior surface and adapted to supply liquid metal to at least a portion of the chamber peripheral interior surface;

wherein at least some of the metal liquid absorbs heat from a spatially varying thermal load provided to the housing upper surface, and redistributes the absorbed heat over the chamber via evaporation and condensation of the metal.

2. The apparatus of claim 1, wherein the housing includes:
a top plate defining the housing upper surface;
a planar bottom plate defining the housing lower surface; and
an annular sidewall having an upper and a lower rim, wherein the top plate seals the housing at the upper rim and the bottom plate seals the housing at the lower rim.

3. The apparatus of claim 1, wherein the metal includes an alkali metal.

4. The apparatus of claim 1, wherein the constant background temperature is between about 350° C. and about 450° C.

5. A chuck apparatus for supporting a substrate, comprising:
a heater module including:
a housing having a planar upper surface, a lower surface, and an enclosed interior chamber with a chamber peripheral interior surface;
a metal in liquid and vapor form ("metal liquid/vapor") held in the chamber at a substantially constant background temperature;
one or more heating elements arranged within the chamber interior and adapted to heat the housing and the metal liquid/vapor to a background temperature; and
one or more wicks arranged adjacent the chamber peripheral interior surface and adapted to supply liquid metal to at least a portion of the chamber peripheral interior surface;
wherein at least some of the metal liquid absorbs heat from a spatially varying thermal load provided to the housing upper surface, and redistributes the absorbed heat over the chamber via evaporation and condensation of the metal,
a heat sink; and
an insulator layer arranged between the housing lower surface and an upper surface of the heat sink, the insulating layer adapted to maintain a substantially constant thermal gradient between the heater module and the heat sink.

6. The apparatus of claim 5, further including:
a power supply operably coupled to the one or more heating elements and adapted to supply a variable amount of electrical power thereto;
a heater controller operably coupled to the power supply and adapted to control the power supply to deliver the variable amount of electrical power to the one or more heating elements;
one or more temperature probes arranged within the chamber and operably coupled to the heater controller, and adapted to provide the heater controller with respective one or more temperature signals; and
wherein the variable amount of electrical power supplied to the one or more heating elements is based on the difference between the desired background temperature and the one or more temperature measurement signals.

7. The apparatus of claim 5, wherein the metal includes one of cesium, sodium and potassium.

8. The apparatus of claim 5, wherein the insulating layer includes at least one of fused silica and quartz.

9. The apparatus of claim 5, wherein the heat sink includes a cooled plate having a cooling channel formed therein, and a cooling unit operably coupled to the cooling channel and adapted to flow a cooling fluid through the cooling channel.

10. A chuck apparatus for a laser thermal processing a substrate, comprising:
a housing having a planar upper surface, a lower surface, and an enclosed interior chamber with a chamber peripheral interior surface, the chamber adapted to contain a metal in liquid and vapor form;
one or more heating elements arranged within the chamber interior and adapted to heat the housing and the metal liquid/vapor to a background temperature; and
one or more wicks arranged adjacent the chamber peripheral interior surface and adapted to supply liquid metal to most or all of the chamber peripheral interior surface;
wherein portions of the metal liquid/vapor are redistributed within the chamber by vaporizing the liquid metal at a hot spot within the chamber formed by heat transferred from the substrate to the chamber, and condensing the metal vapor away from the hot spot.

11. The chuck apparatus of claim 10, wherein the metal includes an alkali metal.

12. The chuck apparatus of claim 10, further including a heat sink in thermal communication with the housing and adapted to remove heat from the chamber.

13. A method for maintaining a substantially constant background temperature of a substrate subject to a spatially varying thermal load, comprising:
transferring the spatially varying thermal load from the substrate to a heater module having a top that supports the substrate, and a sealed chamber having a peripheral interior surface, the chamber being adapted to hold a metal liquid/vapor, including holding some of the liquid metal adjacent most or all of the peripheral interior surface;
maintaining the heater module and the metal liquid/vapor contained therein at a substantially constant background temperature;
distributing heat transferred from the substrate to the chamber through selective evaporation and condensation of the metal liquid/vapor; and
removing heat from the chamber in an amount greater than that provided by the spatially varying thermal load, less an amount of heat lost by radiation and convection from the heater module and the substrate, to be able to perform the step of maintaining the substantially constant background temperature by varying the heat input.

14. The method of claim 13 further includes the step of providing the spatially varying thermal load to the substrate by irradiating the substrate with a laser beam in order to perform laser thermal processing of the substrate.

15. The method of claim 13 further includes the step of providing one or more of potassium, sodium and cesium as the metal liquid/vapor to the chamber.

16. The method of claim 13, wherein the step of removing heat from the chamber includes providing a heat sink in the form of a cooling plate in thermal communication with the heater module chamber through an insulator layer.

17. The method of claim 13 further includes the step of forming the insulating layer to maintain a substantially constant thermal gradient between the heater module and the heat sink.

18. A method for maintaining a substrate at a substantially constant background temperature while subjecting the substrate to a spatially varying thermal load, comprising the steps of:

transferring heat associated with the spatially varying thermal load from the substrate to a metal liquid/vapor held within a sealed chamber in thermal communication with the substrate, to form within the chamber a hot spot surrounded by cooler regions; and redistributing portions of the metal liquid/vapor by vaporizing the liquid metal at the hot spot, and condensing the metal vapor in the cooler regions to uniformize the temperature of the sealed chamber and the substrate.

19. The method of claim 18, further including the step of:

maintaining the temperature of the sealed chamber and the metal liquid/vapor at a substantially constant background temperature.

20. The method of claim 18, further including the step of:

thermally coupling the sealed chamber to a heat sink adapted to remove a substantially constant amount of heat at least equal to a maximum temporal variation in the thermal load, less an amount of heat lost through convection and radiation from the substrate and the chamber.

* * * * *